United States Patent
Stankus

(12)
(10) Patent No.: US 6,417,077 B1
(45) Date of Patent: Jul. 9, 2002

(54) EDGE GROWTH HETEROEPITAXY PROCESSES WITH REDUCED LATTICE MISMATCH STRAIN BETWEEN A DEPOSITED SEMICONDUCTOR MATERIAL AND A SEMICONDUCTOR SUBSTRATE

(75) Inventor: John J. Stankus, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/499,285

(22) Filed: Feb. 7, 2000

(51) Int. Cl.[7] ................................. H01L 21/20
(52) U.S. Cl. .................. 438/478; 438/47; 438/94
(58) Field of Search ............... 428/47, 94, 42, 428/43, 483, 478, 41, 481

(56) References Cited

U.S. PATENT DOCUMENTS

| | | | |
|---|---|---|---|
| 4,826,784 A | * | 5/1989 | Salerno et al. |
| 4,876,210 A | * | 10/1989 | Barnett et al. |
| 5,032,893 A | * | 7/1991 | Fitzgerald, Jr. et al. |
| 5,158,907 A | | 10/1992 | Fitzgerald, Jr. ............. 437/126 |
| 5,272,105 A | * | 12/1993 | Yacobi et al. |
| 5,285,086 A | | 2/1994 | Fitzgerald, Jr. ............. 257/85 |
| 5,578,521 A | * | 11/1996 | Suzuki et al. |
| 5,629,532 A | * | 5/1997 | Myrick |
| 5,828,088 A | * | 10/1998 | Mauk |
| 5,919,305 A | * | 7/1999 | Solomon |
| 5,959,308 A | * | 9/1999 | Shichijo et al. |
| 6,184,144 B1 | * | 2/2001 | Lo |

* cited by examiner

Primary Examiner—Keith Christianson
Assistant Examiner—Stephen W. Smoot
(74) Attorney, Agent, or Firm—James L. Clingan, Jr.

(57) ABSTRACT

Semiconductor devices that include mismatched lattice crystal interfaces are produced by edge growth heteroepitaxy from a crystal with a small surface area to decrease crystal mismatch strain, achieving a crystal with reduced displacement faults. Mismatched crystal lattices are also deposited on a deformable thin membrane of semiconductor material to reduce strain in growing crystal and to reduce displacement faults to achieve a monolithic crystal structure.

9 Claims, 2 Drawing Sheets

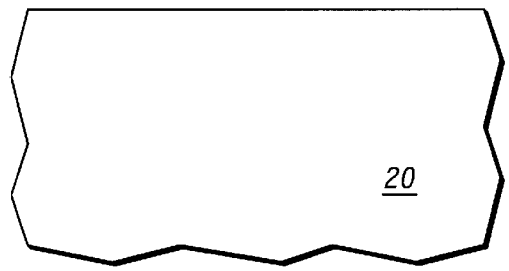
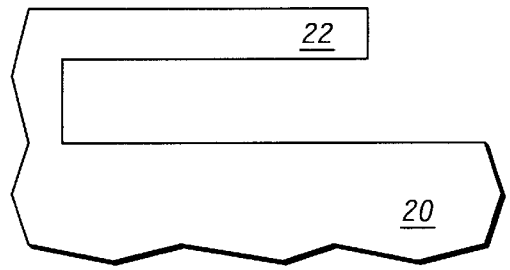
FIG.1  FIG.2
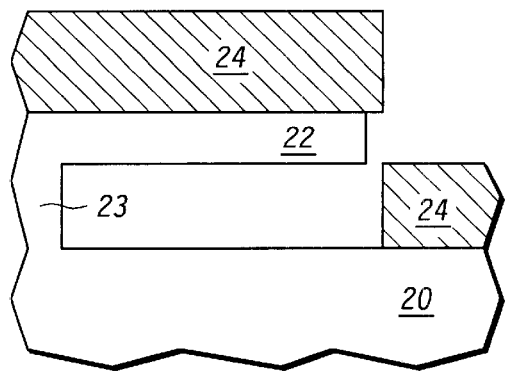
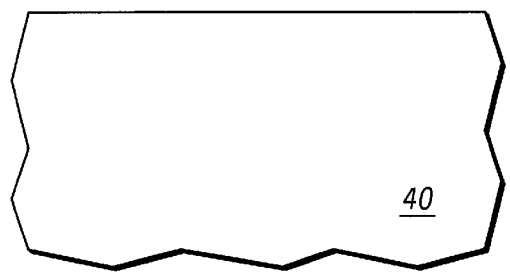
FIG.3  FIG.4
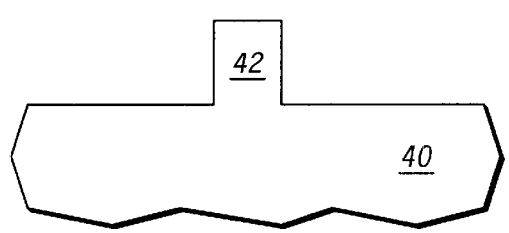
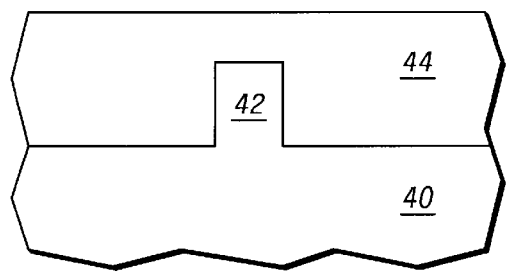
FIG.5  FIG.6

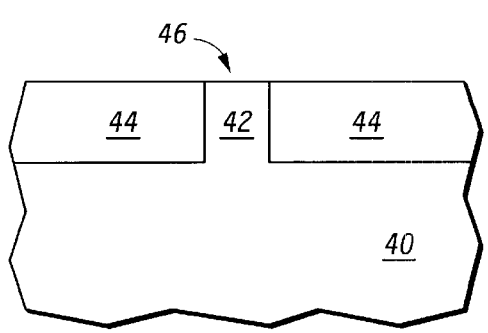
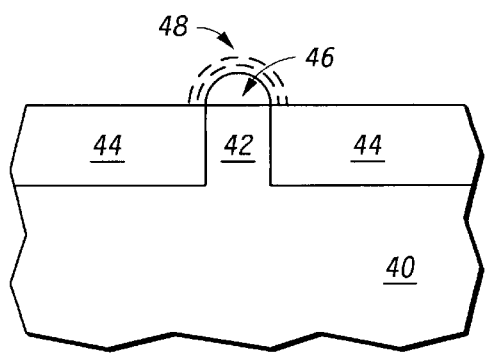
*FIG.7*  *FIG.8*
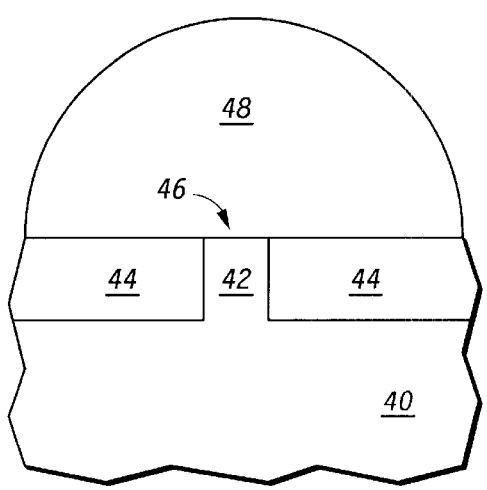
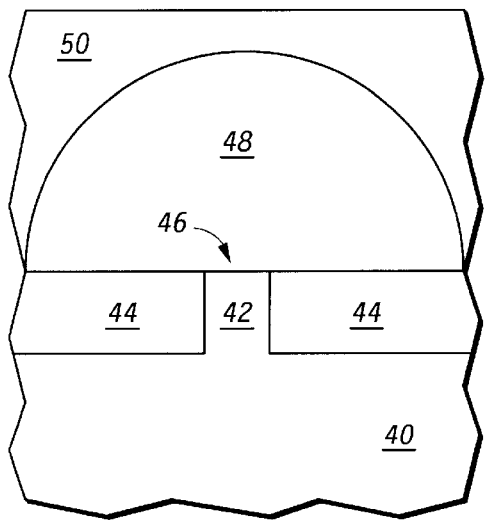
*FIG.9*  *FIG.10*
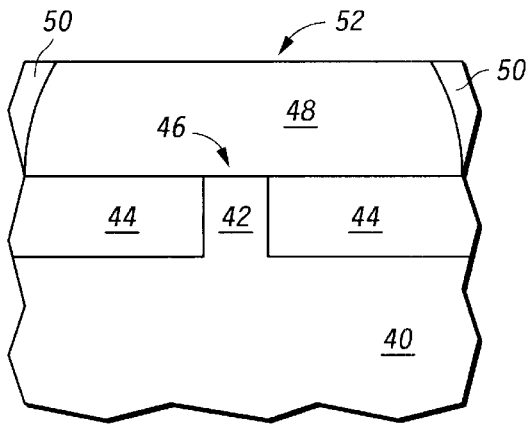
*FIG.11*

EDGE GROWTH HETEROEPITAXY PROCESSES WITH REDUCED LATTICE MISMATCH STRAIN BETWEEN A DEPOSITED SEMICONDUCTOR MATERIAL AND A SEMICONDUCTOR SUBSTRATE

FIELD OF THE INVENTION

The present disclosure is in the field of semiconductor fabrication, in particular the field of growth of lattice mismatched crystals in a semiconductor device.

RELATED ART

There is a need in the semiconductor industry for devices in which adjoining layers in a semiconductor device comprise monocrystalline layers in which the lattice structures of the two crystal layers do not match. These are known as lattice mismatched substrates. The difficulty in producing such devices is that the mismatch of the crystalline lattice structure at the interface creates a strain in a growing crystal layer, and this strain leads to dislocation defects that introduce unwanted changes in the electrical and optical properties of the crystal structure. One way of avoiding these dislocation problems has been to limit adjoining semiconductor layers to those which have very closely lattice matched crystal structures. This strategy is limited, however, in that very few lattice matched systems have large enough energy band offsets to be useful for new devices.

There is a particular need in the art, for example, for an efficient method of depositing a direct bandgap material onto a silicon substrate, which is an indirect bandgap material. This would allow the incorporation of further electronic devices such as optical emitters and detectors to be incorporated into silicon VLSI circuitry on a CMOS device. One solution to this problem has been what is termed flip-chip bonding of group III-V material to silicon. This technique involves production of a silicon substrate and a separate gallium arsenide substrate, for example, which are directly bonded face to face with an array of solder balls. This method of producing the device has a low yield due to the difficulty of aligning such devices and ensuring that all the solder balls are making good contact. Another solution has been described in U.S. Pat. No. 5,158,907, which describes semiconductor devices having a low density of dislocation defects that are formed from epitaxial layers grown on defective or misfit substrates. As described in this patent, many misfit dislocations have thread-like vertical components, termed threading segments, which terminate at a surface of the crystal structure. These defects will continue through the crystal layers to a surface, such as a lateral surface, which does not cause a problem, or they may reach to the top of the crystal layer, making it an unsuitable substrate for an optical device. By depositing a layer of gallium arsenide, for example, onto a silicon surface wherein the deposited layer is relatively much thicker than the area of the interface, the threading segments or defaults propagate to the sides of the deposited layer thus creating a monocrystalline surface at the top. There is still a need, however, for a technique of depositing a mismatched lattice layer onto a silicon substrate in which dislocation defects are not formed.

BRIEF DESCRIPTION OF DRAWINGS

The present invention is illustrated by way of example and not limitation in the accompanying figures, in which like references indicate similar elements, and in which:

FIG. 1 is a schematic cross-section of a standard silicon substrate;

FIG. 2 is a schematic cross-section of a diving board structure produced by a micromachining of the device of FIG. 1;

FIG. 3 is a schematic cross-section of a first embodiment of the present invention;

FIG. 4 is a schematic cross-section of a standard silicon substrate;

FIG. 5 is a schematic cross-section of a first step in the production of a second embodiment of the present invention in which a narrow strip has been etched in a silicon substrate;

FIG. 6 is a schematic cross-section of a subsequent step to the device shown in FIG. 5, in which an oxide layer has been deposited upon the silicon substrate;

FIG. 7 is a schematic cross-section of a subsequent processing step of the device in FIG. 6, in which the surface has been planarized;

FIG. 8 is a schematic cross-section of a subsequent step in the second embodiment of the present invention in which a heteroepitaxial layer has been deposited on a silicon surface;

FIG. 9 is a schematic cross-section of the device of FIG. 8 after deposition of a heteroepitaxial layer;

FIG. 10 is a schematic cross-section of a subsequent step in the production of the second embodiment of the invention in which an oxide layer has been deposited upon the heteroepitaxial layer and FIG. 11 is a schematic cross-section of a second embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Turning to the drawings, FIGS. 1–3 illustrate a device having a mismatched lattice crystal structure growth on a thin membrane or thin semiconductor material substrate. In the embodiment shown, a standard semiconductor material such as a silicon substrate 20 as shown in FIG. 1 is subjected to a micro-machining technique as is known in the art in order to remove a portion of the semiconductor material laterally under the surface, and to create a void under a thin membrane of semiconductor material. In one embodiment, a diving board structure as shown in FIG. 2 is used. The structure shown in FIG. 2 may be created by a micromachining technique including an anisotropic etch, i.e. an etch that is selective for a single face of a crystal, that removes silicon material beneath a thin membrane surface layer 22. Alternatively one may use a "silicon on insulator" substrate (SOI), in which an oxide layer beneath a narrow silicon membrane is etched away with a standard etch such as an HF etch. One could also achieve a thin membrane by an anisotropic etch in which the thin membrane would be supported on both ends by a thicker silicon substrate and having a void under a center section. Such a substrate would resemble the "diving board" structure of FIG. 2 in cross section, except that the top member would reach completely across the void. In preferred embodiments the thin membrane may be less than about 0.5 microns in thickness as long as the membrane has sufficient thickness to support any devices to be deposited thereon. As described above, in deposition of a heteroepitaxial layer on a silicon substrate, the mismatching of the crystal lattices will cause a strain in the growing crystalline structure, and the force of this strain is the cause of defects in the crystal. It is an object of the present invention that the thin silicon membrane is flexible or deformable due to its thinness, and would absorb the strain caused by the lattice mismatch thus allowing the upper layer to form a monolithic crystal. In the practice of one embodiment of the present invention, as shown in FIG. 3, a heteroepitaxial layer, such as a group III-V compound semiconductor layer 24, is deposited on the substrate shown in FIG. 2. Although the present invention will be useful in a variety of applications, including the deposition of any mismatched lattice crystals, a particularly preferred embodiment is the deposition of a direct band gap material such as gallium arsenide onto a silicon substrate. The deposited layer may also be, for example, any direct band gap material such as gallium arsenide, indium phosphide, any group III-V compound materials or any other lattice mismatched materials known in the art. As shown in FIG. 3 after the upper layer is deposited on the silicon substrate the device may be polished with a standard CMP technique, for example, in order to achieve a planar surface for the addition of an opto-electronic or optical interconnect device. It is contemplated that those regions of lattice that are deposited on the thicker silicon 23 that supports the thin membrane area 22 will contain defects. In the practice of the invention this area may be etched away as the substrate is prepared for standard CMOS circuitry that may be connected to devices supported on the deposited layer 24 via standard connection techniques. In preferred embodiments the device shown in FIG. 3 will provide a substrate for optoelectronic devices such as a vertical cavity surface emitting laser (VCSEL), photo detector or light emitting diode (LED).

In an alternative embodiment, one may achieve a monocrystalline structure grown on a heteroepitaxial surface by an edge growth technique as shown in FIGS. 4–11. Without limiting the invention to any particular theoretical basis, it is understood that the dislocations or faults in the mismatched lattice layer are caused by the differences in the dimensions of the crystal lattice structures at the interface of the two layers. As the surface area of this interface becomes larger the strain caused by these mismatches also increases. It is therefore an object of this invention to provide a minimal surface area as the interface between two mismatched lattice layers in order to minimize the strain on the deposited crystal structure. By limiting the interface to a dimension of less than 500 angstroms in width, and preferably to about 100–300 angstroms, and more preferably to about 200 angstroms in width the strain caused by crystal lattice mismatch is not sufficient to cause a high density of dislocation faults, thus enabling the deposition of an edge heteroepitaxial growth of a monolithic crystal. In a preferred embodiment of the invention, a standard silicon substrate as shown in FIG. 4 is etched by standard etching techniques in order to achieve a narrow strip, or projection 42 of the silicon substrate 40 as shown in FIG. 5.

As shown in FIG. 6, in the practice of this embodiment, an oxide or non-wetting layer 44 is deposited over the silicon substrate 40 and over the thin strip 42. This may result in a planar surface as shown in FIG. 6, or it may not. In either case, this layer may then be polished by a standard planarizing CMP polish technique in order to achieve a planar surface 46 of the silicon projection that is used for the heteroepitaxial growth as shown in FIG. 7. As shown in FIG. 8, a group III-V material such as gallium arsenide may then be deposited on the silicon substrate. The gallium arsenide compound will be preferably formed on the surface 46, and the gallium and arsenic atoms will have a high mobility across the surface of the nonwetting layer 44, leading to a deposition of the material as shown in FIG. 9. In this way a relatively large monolithic crystalline substrate surface may be created with relatively few displacement faults because of the small surface area, and thus low strain forces, from which it has grown. The surface may be further prepared as shown in FIG. 10 by deposition of a standard oxide layer 50 over the substrate 48 which may then be polished by standard techniques to achieve a planar surface 52 as shown in FIG. 11. The device shown in FIG. 11 is a suitable substrate for a variety of applications such as for optoelectronic devices or optical interconnect applications that would include, but would not be limited to, vertical cavity surface emitting lasers, photo detectors such as metal-silicon-metal photo detectors as well as light emitting diodes, and also including non-optoelectronic applications of high speed transistors such as HBTs, and MESFETs.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A process for forming on a substrate of a first semiconductor material a monocrystalline structure of a second semiconductor material, comprising the steps of:

removing a portion of the first semiconductor material laterally under a surface of the substrate to form a void under a first portion of the surface, wherein the void and the first portion of the surface form a diving board structure and wherein the first portion of the surface is a silicon membrane sufficiently thin to be at least one of flexible and deformable; and depositing the second semiconductor material on the first portion of the surface to form the monocrystalline structure.

2. The process of claim 1, wherein the first material is silicon and the second material is gallium arsenide.

3. The process of claim 1, wherein the first portion has a thickness of less than 0.5 micron.

4. The process of claim 3, wherein the first material is silicon and the second material is gallium arsenide.

5. A process for forming, on a substrate of a first semiconductor material, a monocrystalline structure of a second semiconductor material, comprising the steps of:

forming a narrow strip of the first semiconductor material surrounded by a material having a relatively high surface mobility with respect to the second semiconductor material; and epitaxially depositing the second semiconductor material on the narrow strip to form the monocrystalline structure by using the narrow strip at the time of deposition as a seed layer so that the monocrystalline structure is monocrystalline in character as it is deposited.

6. The process of claim 5 further comprising planarizing the second semiconductor material.

7. The process of claim 5, wherein the narrow strip is less than 500 Angstroms in width.

8. The process of claim 7 further comprising planarizing the second semiconductor material.

9. The process of claim 8 wherein the first material is silicon and the second material is gallium arsenide.

* * * * *